United States Patent
Kotlar

(10) Patent No.: US 10,681,801 B2
(45) Date of Patent: Jun. 9, 2020

(54) MOUNTING ASSEMBLY WITH A HEATSINK

(71) Applicant: CPT GROUP GMBH, Hannover (DE)

(72) Inventor: Aurelian Kotlar, Timisoara (RO)

(73) Assignee: CPT Group GmbH, Hannover (DE)

( * ) Notice: Subject to any disclaimer, the term of this patent is extended or adjusted under 35 U.S.C. 154(b) by 0 days.

(21) Appl. No.: 16/341,997

(22) PCT Filed: Oct. 12, 2017

(86) PCT No.: PCT/EP2017/076131
§ 371 (c)(1),
(2) Date: Apr. 15, 2019

(87) PCT Pub. No.: WO2018/069476
PCT Pub. Date: Apr. 19, 2018

(65) Prior Publication Data
US 2019/0254157 A1    Aug. 15, 2019

(30) Foreign Application Priority Data
Oct. 14, 2016  (EP) ..................... 16465550

(51) Int. Cl.
*H05K 1/02* (2006.01)
*H05K 7/20* (2006.01)

(52) U.S. Cl.
CPC ........... *H05K 1/0204* (2013.01); *H05K 7/205* (2013.01); *H05K 2201/0187* (2013.01); *H05K 2201/068* (2013.01); *H05K 2201/09054* (2013.01)

(58) Field of Classification Search
CPC ..... H05K 1/021; H05K 1/0203; H05K 1/0209
See application file for complete search history.

(56) References Cited

U.S. PATENT DOCUMENTS

| | | | |
|---|---|---|---|
| 4,509,096 A | 4/1985 | Baldwin et al. |
| 4,941,067 A | 7/1990 | Craft |
| 5,172,755 A | 12/1992 | Samarov |
| 5,920,458 A | 7/1999 | Azar |
| 7,457,126 B2 | 11/2008 | Ahrens |
| 8,354,684 B2 | 1/2013 | West |
| 8,929,077 B2 | 1/2015 | Gouramanis |
| 9,209,163 B2 | 12/2015 | Kao et al. |
| 9,668,334 B2 | 5/2017 | Refai-Ahmed et al. |

(Continued)

FOREIGN PATENT DOCUMENTS

| | | |
|---|---|---|
| CN | 1909424 A | 2/2007 |
| CN | 103384924 A | 11/2013 |

(Continued)

*Primary Examiner* — Jeremy C Norris
(74) *Attorney, Agent, or Firm* — Laurence A. Greenberg; Werner H. Stemer; Ralph E. Locher

(57) ABSTRACT

A mounting assembly includes an electronic component mounted on an upper surface of a circuit board and having at least one electrical connector and a thermal pad provided on a lower surface of the component. The circuit board is mounted on a heatsink and provided with an opening beneath the thermal pad of the component. The heatsink has a heatsink extension which extends through the circuit board and is spatially separated therefrom. A thermal interface material is provided to ensure an electrically insulating thermal connection between the thermal pad and the heatsink extension.

11 Claims, 1 Drawing Sheet

(56) References Cited

U.S. PATENT DOCUMENTS

| | | |
|---|---|---|
| 2003/0011054 A1 | 1/2003 | Jeun et al. |
| 2006/0061969 A1 | 3/2006 | Nilson et al. |
| 2008/0198557 A1 | 8/2008 | Lim et al. |
| 2010/0000766 A1* | 1/2010 | Loiselet ................ H01L 23/433 174/252 |
| 2010/0072511 A1 | 3/2010 | Lin et al. |
| 2011/0272179 A1 | 11/2011 | Vasoya |

FOREIGN PATENT DOCUMENTS

| | | | |
|---|---|---|---|
| CN | 103438409 | A | 12/2013 |
| CN | 105101747 | A | 11/2015 |
| CN | 105340078 | A | 2/2016 |
| DE | 19601649 | A1 | 7/1997 |
| GB | 2460124 | A | 11/2009 |
| JP | H09213877 | A | 8/1997 |

\* cited by examiner

MOUNTING ASSEMBLY WITH A HEATSINK

BACKGROUND OF THE INVENTION

Field of the Invention

The present disclosure relates to a mounting assembly comprising an electronic component mounted on a surface of a circuit board with an electrical connection between the component and a contact pad, which circuit board is mounted on a heatsink.

Description of the Related Art

With the advent of surface mounting of semiconductor packages, multilayer printed circuit boards and multilayer substrates were introduced. In order to create electrical interconnections between the different metal layers, vias are fabricated. These vias also provided a thermal path to transfer heat away from the semiconductor package to a heatsink and finally to the ambient. This is particularly useful for power components and in a typical approach, a cooling pad is provided between the semiconductor package and the printed circuit board material with an array of thermal vias conducting the heat through the PCB material to a thermal interface material mounted on the heatsink material.

The cooling of the component is determined by the thermal resistance of the thermal path between the power component and the heatsink. By far the most significant part of this thermal resistance is the part of the path from the cooling pad to the thermal interface material on the heatsink.

Various proposals have been made which do not require the use of the conventional thermal via. U.S. Pat. No. 8,929,077 discloses the use of a component which is sometimes referred to as a so-called "PowerPEG". This thermal connector includes a top segment which is in thermal engagement with a heat source such as a power component disposed on the top surface of a printed circuit board through an opening of the printed circuit board. A middle segment of the thermal connector extends from the top segment, a flanged portion engaging the bottom surface of the printed circuit board. A bottom segment of the thermal connector extends from the middle segment to a heatsink.

US 2011/272179 A1 discloses a printed circuit board with an embossed hollow heatsink pad. Cut-out windows in the printed circuit board provide openings through the dielectric and circuit layers. A thermally conductive layer is laminated to the second surface of the dielectric layer. The thermally conductive layer includes at least one sinkpad that passes through the cut-out windows.

SUMMARY OF THE INVENTION

It is an object of the present disclosure to provide an improved mounting assembly.

A mounting assembly is disclosed. It comprises an electronic component, a circuit board and a heatsink. The mounting assembly may also be denoted as a circuit-board assembly.

The electronic component comprises at least one electrical connector and a thermal pad. Each electrical connector is in particular configured and arranged for electrically connecting the electronic component to a respective contact pad of the circuit board. For example, the electrical connector is a metal leg. In an expedient embodiment, each electrical connector is soldered to the respective contact pad.

The thermal pad is provided on a lower surface of the component. The lower surface faces in particular towards the circuit board and preferably adjoins the circuit board in some places. In one embodiment, the thermal pad is without electrical function. In another embodiment, the thermal pad is configured for electrically grounding the component.

In one embodiment, the electronic component is a semiconductor component. For example it comprises a semiconductor die such as an integrated circuit (IC), a light-emitting diode, a power transistor, or the like. Expediently, the electronic component may comprise a casing, e.g. a plastic casing such as a molded plastic housing. The semiconductor die is preferably arranged in the casing of the electronic component. In one embodiment the at least one electrical connector projects laterally from the casing.

The circuit board is in particular a printed circuit board. In one embodiment, it is a multilayered circuit board having, for example 3, 4 or more stacked layers of conductor tracks in and on a dielectric base body.

The electronic component is mounted on a upper surface of a circuit board. The electrical connector(s) of the component is/are electrically contacted to the contact pad(s) of the circuit board. The contact pads are in particular arranged on the upper surface of the circuit board. In particular in an embodiment in which the electrical connectors are legs projecting laterally from the casing of the electronic component, the contact pads do not overlap or at least partially overlap the casing in top view of the upper surface of the circuit board. It is also conceivable that the electrical connectors of the components are contact pads which are arranged at the lower surface of the component. In this case, the contact pads of the circuit board may expediently overlap with the casing partially or completely in top view of the upper surface.

The circuit board is mounted on the heatsink, in particular with a lower surface opposite of its upper surface on which the electronic component is mounted. The circuit board is provided with an opening which in particular penetrates the surface board from the upper surface to the lower surface.

The thermal pad of the component is preferably arranged on or over the upper surface of the circuit board. In other words, the thermal pad follows the upper surface of the circuit board in direction from the lower surface towards the upper surface of the circuit board and adjoins or is spaced apart from the upper surface.

The opening is arranged beneath the thermal pad which is provided on the lower surface of the component. In other words, the thermal pad overlaps—and preferably completely overlaps—the opening in top view of the upper side of the circuit board. In one development, the thermal pad projects laterally beyond the opening.

The heatsink has a heatsink extension which extends through the circuit board, in particular through the opening. The heatsink extension is preferably in one piece with a base body of the heat sink, which base body in particular follows the lower surface of the circuit board in direction away from the upper surface. The expression "in one-piece" means in the present context that the base body and the heatsink extension are not assembled from a plurality of parts, which are connected to one another during the manufacturing process of the heatsink. Rather, the base body and the extension are a single workpiece or made from a single workpiece. In particular, the base body and the extension of the heat sink are made from the same metal or alloy.

The heatsink extension is preferably spatially separated from the circuit board. In particular, there is a lateral gap between the heatsink extension and the peripheral wall of the opening, the gap preferably extending completely circumferentially around the heatsink extension in the opening.

The mounting assembly comprises a thermal interface material which is provided to ensure an electrically insulating thermal connection between the thermal pad and the heatsink extension.

Thermal interface materials are known, in principle, to the person skilled in the art. The thermal interface material may expediently be an electrically insulating material. The thermal interface material is preferably soft, i.e. it is elastically and/or plastically deformable, so that is in particular operable to compensate for dimensional and/or positional changes of the electronic component and/or the circuit board and/or the heat sink due to thermal expansion. Preferably, the thermal interface material is selected from the group consisting of: a thermal grease, a thermal glue, a curing thermal grease, a non-adhesive thermal glue, a thermal pad, a thermal adhesive.

With advantage, the mounting assembly has a particularly low thermal resistance between the component and the heat sink. In addition, the mounting assembly may be particularly tolerant to differential thermal expansion. The amount of strain which is put on the circuit board material is particularly small. This may advantageously lead to a particular long component lifespan, which is an important consideration in automotive applications where a component is required to have a lifetime as long as the expected lifespan of the vehicle.

In one embodiment, the thermal interface material is arranged between an upper surface of the heatsink extension and the thermal pad. Expediently, the thermal insulation material may adjoin the thermal pad and the heatsink extension; preferably it adjoins the mutually facing surfaces of the thermal pad and the heatsink extension.

In another embodiment, the thermal interface material is arranged between the side face (s) of the heatsink extension and the opening of the circuit board. In other words, the thermal interface material partially or completely fills the lateral gap between the heatsink extension and the peripheral wall of the opening. Besides further improving the heat transfer and/or facilitating a simple production of the assembly, lateral movement of the heatsink relative to the circuit board may be dampened by the thermal interface material in the opening, thereby reducing mechanical stress on the assembly.

In a further embodiment, the thermal interface material is arranged between an upper surface of the heat sink—in particular between an upper surface of the base body of the heatsink—and the lower surface of the circuit board. In this way, the thermal interface material may contribute to fixing the heatsink to the circuit board in some embodiments. For example, the heatsink is provided with a layer of thermal interface material covering the base body and the heatsink extension essentially completely in top view of the upper surface of the base body. This may contribute to a particularly easy and cost-efficient manufacturing of the assembly.

In one embodiment, the heat sink extension has the form of a truncated cone or a truncated pyramid. This has advantage of ease of assembly and further reduces the likelihood of stress on the assembly.

In one embodiment, the circuit board comprises a plurality of thermal vias which extend from the thermal pad through the circuit board to the heatsink. The vias may be hollow cylinders of metal—in particular of copper —, which are preferably fabricated by plating a thin layer on the inside surface of a hole drilled through the laminated metal and dielectric layers of the circuit board. The vias may also be solid metal cylinders. The vias are preferably laterally offset from the opening of the circuit board. The component, and in particular its thermal pad, may expediently overlap the vias in top view on the upper surface of the circuit board.

The vias advantageously reduce the thermal resistance further from the component to the heatsink. Preferably, the circuit board comprises a land for the thermal pad which extends laterally around the opening which is located between the heatsink extension and the component. The land for the thermal pad may extend circumferentially—in particular completely circumferentially—around the opening. In an expedient embodiment, the land overlaps the vias in top view of the upper surface of the circuit board. The thermal pad is preferably soldered to the land.

With advantage, the thermal resistance between the component and the heatsink is particularly small. At the same time, a good electrical and/or mechanical contact from the component to the circuit board is achievable, while the heatsink may remain electrically insulated from the component and/or from the circuit boards in all embodiments of the mounting assembly. The decreased thermal resistance means that more power can be dissipated on the same chip or alternatively the operating temperature of the device can be higher than in known solutions.

BRIEF DESCRIPTION OF THE SEVERAL VIEWS OF THE DRAWINGS

An exemplary embodiment of the invention will now be described in greater detail with reference to the drawing in which.

DESCRIPTION OF THE INVENTION

Figure 1:
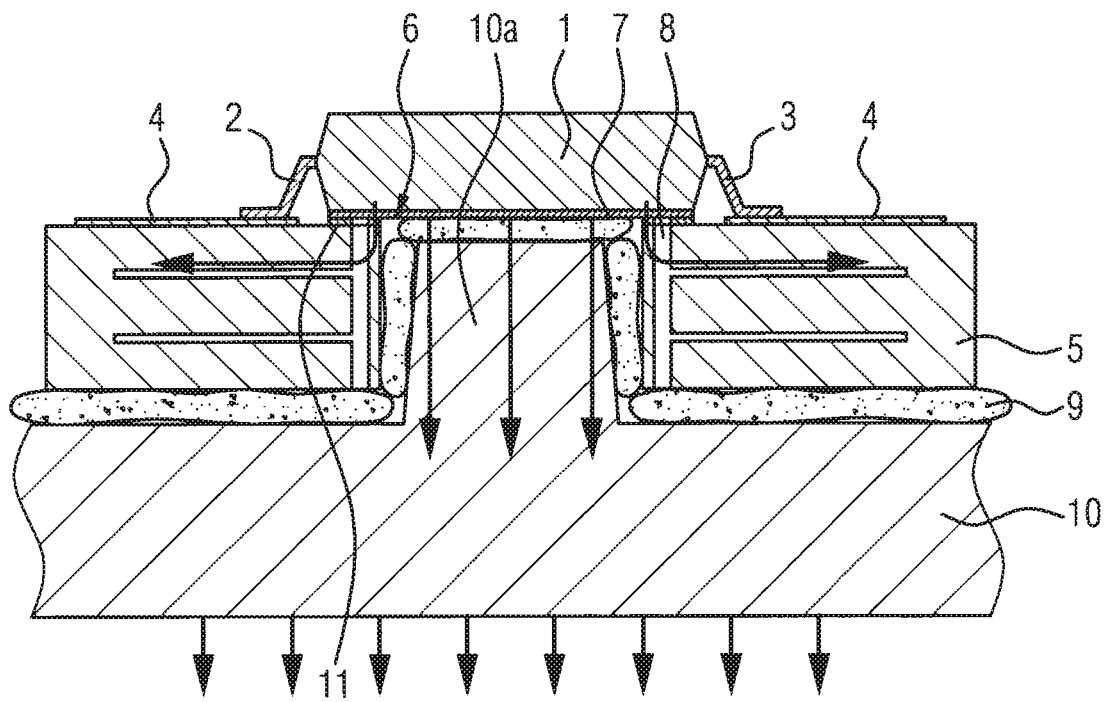
FIG. 1 shows a schematic section view of a mounting assembly according to an exemplary embodiment of the invention

FIG. 1 shows a schematic side view of an electronic component 1 which may, for example, be a discrete LQFP64 (Leadless Quad Flat Pack 64) semiconductor component. The electronic component 1 is surface mounted on an upper surface of a printed circuit board 5 which is shown in cross-section in FIG. 1. The component 1 is shown in FIG. 1 having electrical connectors 2, 3 in the shape of pins which project on opposed sides from a casing of the component 1. Each of the pins is bent to lie against a respective contact pad 4 which is comprised by the printed circuit board (PCB) 5 and arranged on the upper surface thereof.

The lower surface of the component 1 includes a thermal pad 7. In this or other embodiments, the thermal pad 7 is in particular a surface of a metal post which extends from the vicinity of a semiconductor die of the component 1 to a peripheral surface of the component casing. The metal post is in particular separate from bonding wires which may electrically connect the semiconductor die to the electrical connectors 2, 3.

The PCB 5 is provided with an opening 6, the extent of which corresponds to a substantial part of the horizontal extent of the casing of component 1 intermediate to the edges thereof. The opening 6 extends through the PCB 5 from its upper surface to a lower surface of the PCB 5 opposite of the upper surface.

Adjacent to the edge of the opening, the lower surface of the component 1—in particular an edge region of the thermal pad 7—rests on a land 11 for the thermal pad 7 which is comprised by the PCB 5 at its upper surface. The land 11 extends circumferentially around the opening 6. Thermal vias 8 extend from the land 11 for the thermal pad 7 through the printed circuit board 5 to the lower surface of the printed circuit board, remote from the surface on which the component 1 is mounted. The thermal vias 8 and the opening 6 have parallel central axes in this and other embodiments. Preferably, the vias 8 are arranged in annular fashion around the opening 6 in top view of the upper surface of the PCB 5.

The mounting assembly according to the present exemplary embodiment further comprises a heatsink 10, also shown in cross-section in FIG. 1. The heatsink 10 has a base body which is positioned adjacent to the lower surface of the PCB 5 and follows the lower surface in direction away from the upper surface of the PCB 5. An upper surface of the base body faces towards the lower surface of the PCB 5. A heatsink extension 10a is formed integrally and in one piece with the base body. The heatsink extension 10a extends from the upper surface of the base body into the opening 6 of the PCB 5 and preferably to the upper surface of the PCB 5. In one embodiment, a free end of the heatsink extension 10a is coplanar with the upper surface of the PCB 5. The thermal pad 7 of the component 1 overlaps the heatsink extension 10a in top view of the upper surface of the PCB 5. An electrically insulating thermal interface material 9 is provided at the interface between the base body of the heatsink 10 and the PCB 5 and at the interface between the heatsink extension 10a and the thermal pad 7 of the component 1. The heatsink extension 10a extends through the opening 6 in the PCB 5 to make an electrically insulating thermal connection with the thermal interface material 9 in the region of the component casing 1 and the thermal pad 7.

The heatsink extension 10a through the PCB 5 has a truncated conical form such that there is some space between the surface of the heatsink extension 10a and the PCB material representing a peripheral wall of the opening 6. The truncated conical extension 10a of the heatsink 10 has a trapezoidal cross-section. The heatsink extension 10a is dimensioned and positioned to establish a lateral gap between the surface of the heatsink material and the PCB material which is partly or completely filled with the thermal interface material 9 and to permit some differential thermal expansion between the heatsink extension 10a and the PCB 5.

A number of thermal interface materials are commercially available and are usually composite materials with particulate fillers to increase the thermal conductivity. The heatsink can be made out of cast aluminium or from sheet metal aluminium.

Figure 2:
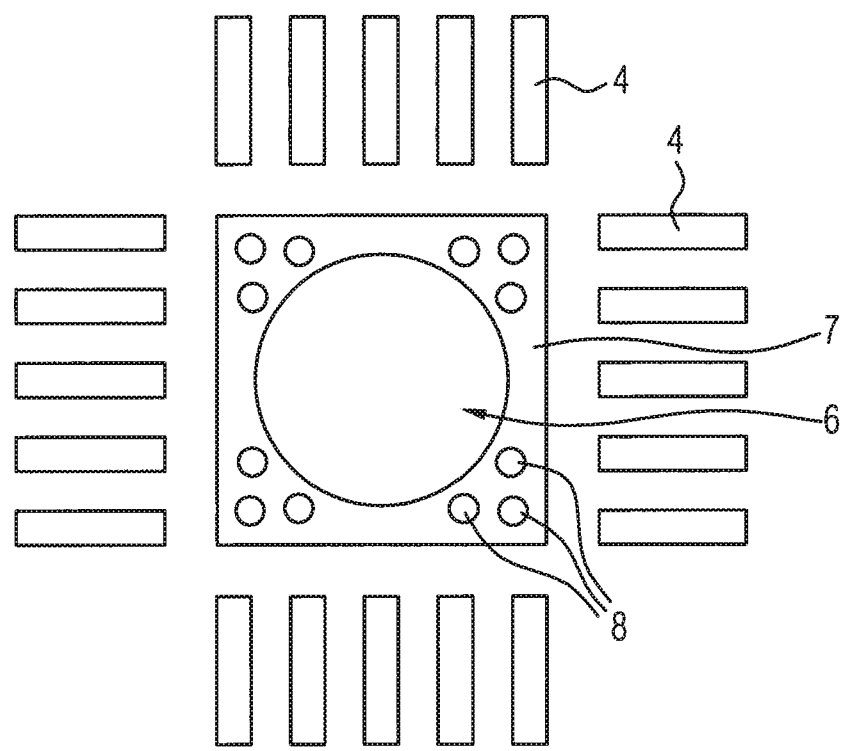
FIG. 2 shows a schematic of a footprint for the assembly.

FIG. 2 shows a schematic of a footprint of the land 11 for the thermal pad 7 and of the contact pads 4. The land 11 for the thermal pad 7 has a substantially square outline with a centrally located generally circular aperture, such that it extends completely circumferentially around the opening 6. The opening 6 enables the heatsink 10 to extend through the PCB 5 to the region of the component casing. Three thermal vias 8 are located in each corner of the land 11 for the thermal pad 7 and are arranged as the vertices of a right angle triangle, the apex of which is adjacent to the corner of the thermal pad 7. Five contact pads 4 are arranged substantially perpendicularly to the respective edges of the square outline of the land for the thermal pad 7.

The thermal pad 7 is coupled to the circuit board by a solder connection between the peripheral region of the thermal pad 7 and the land 11 arranged on the upper surface of the circuit board 5 and to the heat sink extension 10a by means of the portion of the thermal interface material 9 arranged in the central portion of the thermal pad 7.

The extension 10a of the heatsink 10 through the PCB 5 enables the heatsink 10 to make direct thermal contact with the component 1 while remaining electrically insulated from the component 1 and the circuit board 5. At the same time the component thermal pad 7 is soldered onto the PCB 5 to assure a good electrical connection and also a good mechanical connection. The thermal interface material 9 ensures that the thermal pad 7 is electrical insulated from the heatsink 10 whilst at the same time ensuring that there is a low thermal resistance between the thermal pad 7 and the heatsink 10. In high current applications, a good electrical connection is required between the copper ground plane and the plastic ball grid array.

By way of example, a thermal simulation was performed using a standard LQFP64 component 1, which comprises 28 thermal vias through a 1.6 mm PCB with 0.3 mm of thermal interface material between the PCB 5 and the heatsink 10. A modified sample was manufactured using the same thermal interface material 9 and thickness of PCB 5 with a circular hole cut in the PCB material as an opening 6 to receive a dome or truncated cone of aluminium heatsink material as heatsink extension 10a. Applying a continuous power of 1 W to each chip at an ambient temperature of 20° C. produced the results in the table below:

|  | Standard | Modified |
| --- | --- | --- |
| $R_{\theta junction-ambient}$ | 3.48 K/W | 1.11 K/W |
| Max junction temperature | 26° C. | 24.1° C. |

The modified assembly shows a reduction in the thermal resistance between the component 1 and the heatsink 10 of approximately 70% and a reduction in the maximum junction temperature of around 8-10%.

Although the semiconductor electronic component 1 is described as a leadless Quad Flat Pack discrete package, the invention is applicable in other applications where cooling is required such as TO 252 and TO 263 type packages and in cooling high power LEDs, for example. Although the heatsink extension 10a passing through the PCB 5 has been described as having the form of a truncated cone, other shapes would be possible depending on shapes of the thermal pad 7 or electronic component 1. The thermal interface material 9 may be arranged between an upper surface of the heat sink extension 10a and the thermal pad 7 and may further be arranged between the base body of the heat sink 10 and the lower surface of the circuit board 5.

The invention claimed is:
1. A mounting assembly, comprising:
a circuit board having an upper surface, a contact pad and an opening;
an electronic component mounted on said upper surface of said circuit board, said electronic component having a lower surface, a thermal pad provided on said lower surface of said component above said opening of said circuit board, and at least one electrical connector electrically connected to said contact pad of said circuit board;
a heatsink on which said circuit board is mounted, said heatsink having a heatsink extension extending through and spatially separated from said circuit board; and
a thermal interface material ensuring an electrically insulating thermal connection between said thermal pad and said heatsink extension.

2. The mounting assembly according to claim 1, wherein said thermal interface material adjoins said thermal pad and said heatsink extension.

3. The mounting assembly according to claim 1, wherein said heatsink extension has a truncated cone shape or a truncated pyramid shape.

4. The mounting assembly according to claim 1, wherein said heatsink extension has an upper surface, and said thermal interface material is disposed between said upper surface of said heat sink extension and said thermal pad.

5. The mounting assembly according to claim 4, wherein said heat sink extension has lateral faces, and said thermal interface material is also disposed between said lateral faces of said heat sink extension and said opening in said circuit board.

6. The mounting assembly according to claim 5, wherein said circuit board has a lower surface, and said thermal interface material is further disposed between said heat sink and said lower surface of said circuit board.

7. The mounting assembly according to claim 1, wherein said at least one electrical connector is soldered to said contact pad.

8. The mounting assembly according to claim 1, wherein said thermal pad is above and completely outside of said opening of said circuit board.

9. A mounting assembly, comprising:
a circuit board having an upper surface, a contact pad and an opening;
an electronic component mounted on said upper surface of said circuit board, said electronic component having a lower surface, a thermal pad provided on said lower surface of said component above said opening of said circuit board, and at least one electrical connector electrically connected to said contact pad of said circuit board;
a heatsink on which said circuit board is mounted, said heatsink having a heatsink extension extending through and spatially separated from said circuit board;
a thermal interface material ensuring an electrically insulating thermal connection between said thermal pad and said heatsink extension; and
said circuit board including a land for said thermal pad, said land extending laterally around said opening.

10. The mounting assembly according to claim 9, wherein said thermal pad is soldered to said land for said thermal pad.

11. A mounting assembly, comprising:
a circuit board having an upper surface, a contact pad and an opening;
an electronic component mounted on said upper surface of said circuit board, said electronic component having a lower surface, a thermal pad provided on said lower surface of said component above said opening of said circuit board, and at least one electrical connector electrically connected to said contact pad of said circuit board;
a heatsink on which said circuit board is mounted, said heatsink having a heatsink extension extending through and spatially separated from said circuit board;
a thermal interface material ensuring an electrically insulating thermal connection between said thermal pad and said heatsink extension; and
said electronic component having a casing, said circuit board being formed of a material, and a plurality of thermal vias extend through said circuit board material and are thermally coupled to said casing and to said heatsink.

* * * * *